(12) United States Patent
Choi et al.

(10) Patent No.: US 9,966,375 B2
(45) Date of Patent: May 8, 2018

(54) SEMICONDUCTOR DEVICE

(71) Applicants: Yong-Joon Choi, Seoul (KR);
Tae-Yong Kwon, Suwon-si (KR);
Mirco Cantoro, Suwon-si (KR);
Chang-Jae Yang, Seoul (KR);
Dong-Hoon Khang, Daegu (KR);
Woo-Ram Kim, Seoul (KR); Cheol
Kim, Hwaseong-si (KR); Seung-Jin
Mun, Suwon-si (KR); Seung-Mo Ha,
Seoul (KR); Do-Hyoung Kim,
Hwaseong-si (KR); Seong-Ju Kim,
Suwon-si (KR); So-Ra You, Cheonan-si
(KR); Woong-ki Hong, Suwon-si (KR)

(72) Inventors: Yong-Joon Choi, Seoul (KR);
Tae-Yong Kwon, Suwon-si (KR);
Mirco Cantoro, Suwon-si (KR);
Chang-Jae Yang, Seoul (KR);
Dong-Hoon Khang, Daegu (KR);
Woo-Ram Kim, Seoul (KR); Cheol
Kim, Hwaseong-si (KR); Seung-Jin
Mun, Suwon-si (KR); Seung-Mo Ha,
Seoul (KR); Do-Hyoung Kim,
Hwaseong-si (KR); Seong-Ju Kim,
Suwon-si (KR); So-Ra You, Cheonan-si
(KR); Woong-ki Hong, Suwon-si (KR)

(73) Assignee: Samsung Electronics Co., Ltd.,
Gyeonggi-Do (KR)

( * ) Notice: Subject to any disclaimer, the term of this
patent is extended or adjusted under 35
U.S.C. 154(b) by 0 days. days.

(21) Appl. No.: 15/049,648

(22) Filed: Feb. 22, 2016

(65) Prior Publication Data

US 2016/0315085 A1 Oct. 27, 2016

(30) Foreign Application Priority Data

Apr. 24, 2015 (KR) ........................ 10-2015-0057802

(51) Int. Cl.
*H01L 27/092* (2006.01)
*H01L 29/78* (2006.01)
(Continued)

(52) U.S. Cl.
CPC .. *H01L 27/0924* (2013.01); *H01L 21/823431*
(2013.01); *H01L 21/823807* (2013.01);
(Continued)

(58) Field of Classification Search
CPC ........... H01L 21/823821; H01L 29/165; H01L
27/0924; H01L 29/1054; H01L 29/785;
(Continued)

(56) References Cited

U.S. PATENT DOCUMENTS 6,878,580 B2 4/2005 Bae et al.
7,811,891 B2 10/2010 Orlowski et al.
(Continued)

FOREIGN PATENT DOCUMENTS

JP 2006-156687 A 6/2006
JP 4158610 B2 10/2008
(Continued)

*Primary Examiner* — Fernando L Toledo
*Assistant Examiner* — Aaron Gray
(74) *Attorney, Agent, or Firm* — Harness, Dickey &
Pierce, P.L.C.

(57) ABSTRACT

A semiconductor device includes a compound semiconductor layer, where the compound semiconductor layer includes separate fin patterns in separate regions. The separate fin patterns may include different materials. The separate fin patterns may include different dimensions, including one or more of width and height of one or more portions of the fin patterns. The separate fin patterns may include an upper pattern and a lower pattern. The upper pattern and the lower pattern may include different materials. The upper pattern and the lower pattern may include different dimensions. Separate regions may include separate ones of an NMOS or (Continued)

a PMOS. The semiconductor device may include gate electrodes on the compound semiconductor layer. Separate gate electrodes may intersect the separate fin patterns.

15 Claims, 18 Drawing Sheets

(51) Int. Cl.
| | | |
|---|---|---|
| *H01L 21/8234* | (2006.01) | |
| *H01L 29/66* | (2006.01) | |
| *H01L 29/10* | (2006.01) | |
| *H01L 21/8238* | (2006.01) | |
| *H01L 27/02* | (2006.01) | |
| *H01L 27/11* | (2006.01) | |
| *H01L 29/165* | (2006.01) | |

(52) U.S. Cl.
CPC .. *H01L 21/823821* (2013.01); *H01L 27/0207* (2013.01); *H01L 27/1104* (2013.01); *H01L 29/1054* (2013.01); *H01L 29/66795* (2013.01); *H01L 29/785* (2013.01); *H01L 29/165* (2013.01)

(58) Field of Classification Search
CPC ....... H01L 21/823431; H01L 29/66795; H01L 27/0886

USPC ......... 257/401, 369, 190, E27.062; 438/283, 438/154
See application file for complete search history.

(56) References Cited

U.S. PATENT DOCUMENTS

| | | | |
|---|---|---|---|
| 2014/0329368 A1 | 11/2014 | Wang et al. | |
| 2015/0287648 A1* | 10/2015 | Cai | ................. H01L 21/823807 257/369 |
| 2015/0303305 A1* | 10/2015 | Ching | ................. H01L 29/7851 257/192 |
| 2016/0043225 A1* | 2/2016 | Ching | ................. H01L 29/1054 257/401 |
| 2016/0104799 A1* | 4/2016 | Qi | ........................ H01L 29/7849 257/29 |
| 2016/0218105 A1* | 7/2016 | Lee | ..................... H01L 29/7856 |

FOREIGN PATENT DOCUMENTS

| | | |
|---|---|---|
| JP | 2014-192163 A | 10/2014 |
| KR | 10-0590391 B1 | 6/2006 |
| KR | 10-0676828 B1 | 1/2007 |
| KR | 10-2015-0002066 | 1/2015 |

\* cited by examiner

1200

1300

1400

SEMICONDUCTOR DEVICE

CROSS-REFERENCE TO RELATED APPLICATION

This application claims priority from Korean Patent Application No. 10-2015-0057802 filed on Apr. 24, 2015 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device, and more particularly, to a semiconductor device including a fin pattern.

2. Description of the Related Art

As the feature size of a transistor is reduced, a gate length and a length of a channel formed beneath the gate may also be reduced. As the channel length of the transistor is reduced, scattering of electric charges may increase and electric charge mobility in the channel may be reduced. The reduction in the electric charge mobility in the channel may hinder improvement in saturation current of the transistor.

SUMMARY

Some example embodiments provide a semiconductor device in which materials different from each other are used in a channel layer of a PMOS and a channel layer of an NMOS, thereby achieving improved operating performance of a transistor.

However, some example embodiments are not restricted to those set forth herein. Some example embodiments which are not mentioned herein will be clearly understood by a person skilled in the art by referencing the detailed description given below.

According to some example embodiments, there is provided a semiconductor device comprising a compound semiconductor layer including a first region and a second region, a first fin pattern protruding from the compound semiconductor layer in the first region, and a second fin pattern protruding from the compound semiconductor layer in the second region. The first fin pattern includes a first material and being associated with a first width. The second fin pattern includes a second material different from the first material. The second fin pattern is associated with a second width which is narrower than the first width.

In some example embodiments, the first fin pattern includes a first upper pattern and a first lower pattern. The first upper pattern and the first lower pattern are sequentially stacked on the compound semiconductor layer. The first upper pattern includes the first material and the second fin pattern includes a second upper pattern and a second lower pattern. The second upper pattern and the second lower pattern are sequentially stacked on the compound semiconductor layer. The second upper pattern includes the second material.

In some example embodiments, the first material is associated with a first lattice constant, the second material is associated with a second lattice constant, and the first lattice constant is different from than the second lattice constant.

In some example embodiments, the first lattice constant of the material included in the first upper pattern is different from than a lattice constant of a material included in the first lower pattern, and the second lattice constant of the material included in the second upper pattern is larger than a lattice constant of a material included in the second lower pattern.

In some example embodiments, a lattice constant of the first lower pattern is substantially equal to a lattice constant of the second lower pattern.

In some example embodiments, a height of the first upper pattern is different from a height of the second upper pattern.

In some example embodiments, a width of the first upper pattern is wider than a width of the second upper pattern.

In some example embodiments, the first fin pattern includes a first upper pattern and a first lower pattern contacting directly with each other, and the second fin pattern includes a second upper pattern and a second lower pattern contacting directly with each other, and a width of the second upper pattern is different from a width of the second lower pattern at a boundary between the second upper pattern and the second lower pattern.

In some example embodiments, a width of the first upper pattern is substantially equal to a width of the first lower pattern at a boundary between the first upper pattern and the first lower pattern.

In some example embodiments, a width of the first upper pattern is different from a width of the first lower pattern at a boundary between the first upper pattern and the first lower pattern.

In some example embodiments, a height of the first fin pattern is lower than a height of the second fin pattern.

In some example embodiments, a height of the first fin pattern is substantially equal to a height of the second fin pattern.

In some example embodiments, the first region is a region in which an NMOS is formed and the second region is a region in which a PMOS is formed.

In some example embodiments, the semiconductor device may further comprise on the compound semiconductor layer, a first gate electrode intersecting the first fin pattern and a second gate electrode intersecting the second fin pattern.

In some example embodiments, the first fin pattern extends in a first direction, and the first fin pattern extends in a first direction, and a width of the first fin pattern is a width in the second direction.

According to some example embodiments, there is provided a semiconductor device comprising a compound semiconductor layer including a first region and a second region, a first fin pattern which includes a first lower pattern and a first upper pattern sequentially stacked on the compound semiconductor layer in the first region and which is defined by a first trench having a first depth, and a second fin pattern which includes a second lower pattern and a second upper pattern sequentially stacked on the compound semiconductor layer in the second region and which is defined by a second trench having a second depth different from the first depth.

In some example embodiments, a lattice constant of a material included in the first upper pattern is different from a lattice constant of a material included in the second upper pattern, and a lattice constant of a material included in the first lower pattern is substantially equal to a lattice constant of a material included in the second lower pattern.

In some example embodiments, the lattice constant of the material included in the first upper pattern is smaller than the lattice constant of the material included in the second upper pattern, and the first depth is shallower than the second depth.

In some example embodiments, the first upper pattern includes silicon and the second upper pattern includes silicon germanium.

In some example embodiments, a height of the first lower pattern is different from a height of the second lower pattern.

In some example embodiments, a width of the first upper pattern is different from a width of the second upper pattern.

In some example embodiments, a lattice constant of a material included in the first upper pattern is smaller than a lattice constant of a material included in the second upper pattern, and the width of the first upper pattern is wider than the width of the second upper pattern.

In some example embodiments, a width of the second upper pattern is narrower than a width of the second lower pattern at a boundary between the second upper pattern and the second lower pattern.

In some example embodiments, a width of the first upper pattern is substantially equal to a width of the first lower pattern at a boundary between the first upper pattern and the first lower pattern.

In some example embodiments, a width of the first upper pattern is narrower than a width of the first lower pattern at a boundary between the first upper pattern and the first lower pattern.

In some example embodiments, the second upper pattern and the second lower pattern define a sidewall of the second trench. A step difference is formed between a first portion of the sidewall of the second trench defined by the second upper pattern and a second portion of the sidewall of the second trench defined by the second lower pattern.

In some example embodiments, the semiconductor device further comprises on the compound semiconductor layer, a first gate electrode intersecting the first fin pattern, and a second gate electrode intersecting the second fin pattern.

According to some example embodiments, there is provided a semiconductor device comprising a compound semiconductor layer including a first region and a second region, a first fin pattern including a first lower pattern and a first upper pattern sequentially stacked on the compound semiconductor layer in the first region, and a second fin pattern including a second lower pattern and a second upper pattern sequentially stacked on the compound semiconductor layer in the second region. The first lower pattern is a silicon germanium pattern and the first upper pattern is a silicon pattern. The second fin pattern is a silicon germanium pattern. A germanium fraction of the second upper pattern is greater than a germanium fraction of the second lower pattern. A width of the second upper pattern is different from a width of the first upper pattern.

In some example embodiments, the width of the first upper pattern is different from the width of the second upper pattern.

In some example embodiments, a height of the first lower pattern is substantially equal to a height of the second lower pattern.

In some example embodiments, a height of the second lower pattern is greater than a height of the first lower pattern.

In some example embodiments, a height of the first upper pattern is different from a height of the second upper pattern.

In some example embodiments, a width of the first upper pattern is substantially equal to a width of the first lower pattern at a boundary between the first upper pattern and the first lower pattern, and a width of the second upper pattern is substantially equal to a width of the second lower pattern at a boundary between the second upper pattern and the second lower pattern.

In some example embodiments, a width of the first upper pattern is substantially equal to a width of the first lower pattern at a boundary between the first upper pattern and the first lower pattern, and a width of the second upper pattern is narrower than a width of the second lower pattern at a boundary between the second upper pattern and the second lower pattern.

In some example embodiments, a width of the first upper pattern is narrower than a width of the first lower pattern at a boundary between the first upper pattern and the first lower pattern, and a width of the second upper pattern is substantially equal to a width of the second lower pattern at a boundary between the second upper pattern and the second lower pattern.

In some example embodiments, a width of the first upper pattern is narrower than a width of the first lower pattern at a boundary between the first upper pattern and the first lower pattern, and a width of the second upper pattern is narrower than a width of the second lower pattern at a boundary between the second upper pattern and the second lower pattern.

In some example embodiments, the compound semiconductor layer includes silicon germanium.

In some example embodiments, the first lower pattern and the second lower pattern are formed at a same level.

According to some example embodiments, a semiconductor device includes a first fin pattern and a second fin pattern protruding from a compound semiconductor layer. The first fin pattern includes a first material. The second fin pattern includes a second material and is different from the first material.

In some example embodiments, the first fin pattern includes a first upper pattern and a first lower pattern. The first upper pattern and the first lower pattern are sequentially stacked on the compound semiconductor layer. The first upper pattern includes the first material. The second fin pattern includes a second upper pattern and a second lower pattern. The second upper pattern and the second lower pattern are sequentially stacked on the compound semiconductor layer. The second upper pattern includes the second material.

In some example embodiments, the first material includes silicon and the second material includes silicon germanium.

In some example embodiments, the first and second materials are associated with different lattice constants.

BRIEF DESCRIPTION OF THE DRAWINGS

Example embodiments will be described in more detail with regard to the figures, wherein like reference numerals refer to like parts throughout the various figures unless otherwise specified, and wherein.

Figure 1:
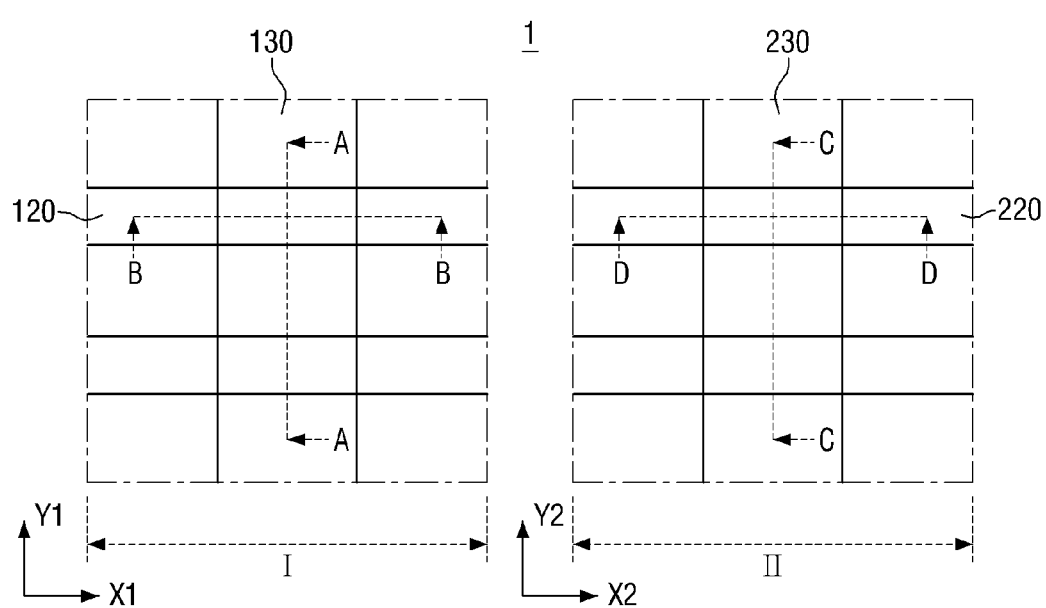
FIG. 1 is a layout diagram illustrating a semiconductor device according to some example embodiments.

It should be noted that these figures are intended to illustrate the general characteristics of methods and/or structure utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments.

DETAILED DESCRIPTION OF THE EMBODIMENTS

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Figure 2:
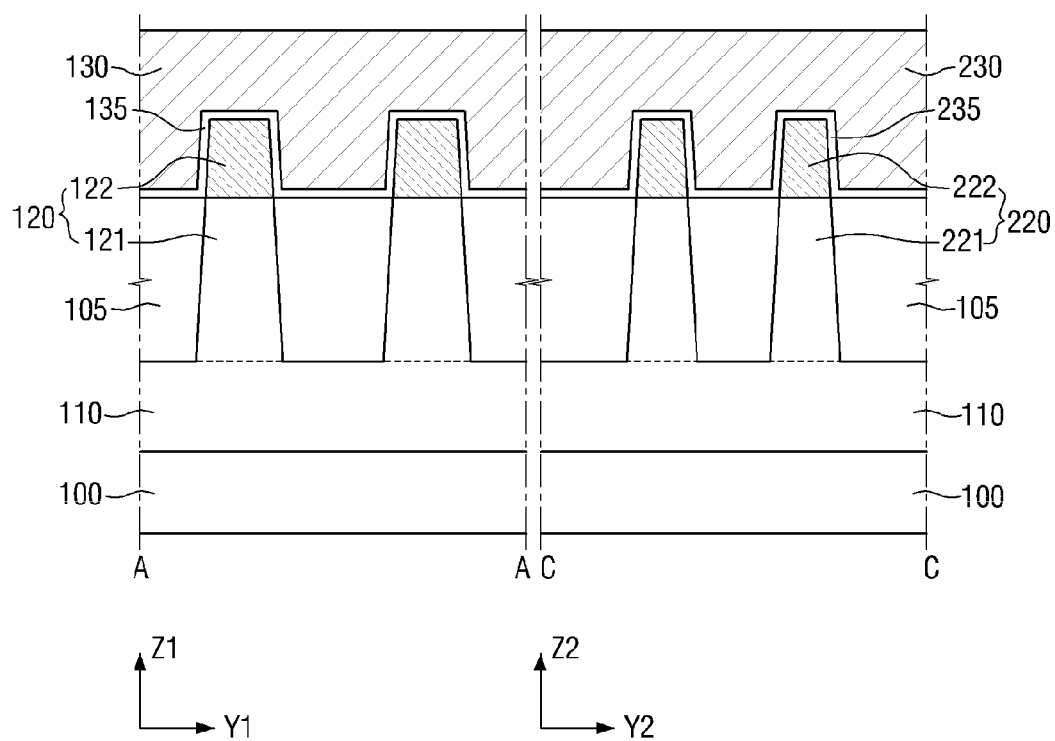
FIG. 2 is a cross-sectional view taken along the lines A-A and C-C of FIG. 1.
Figure 3:
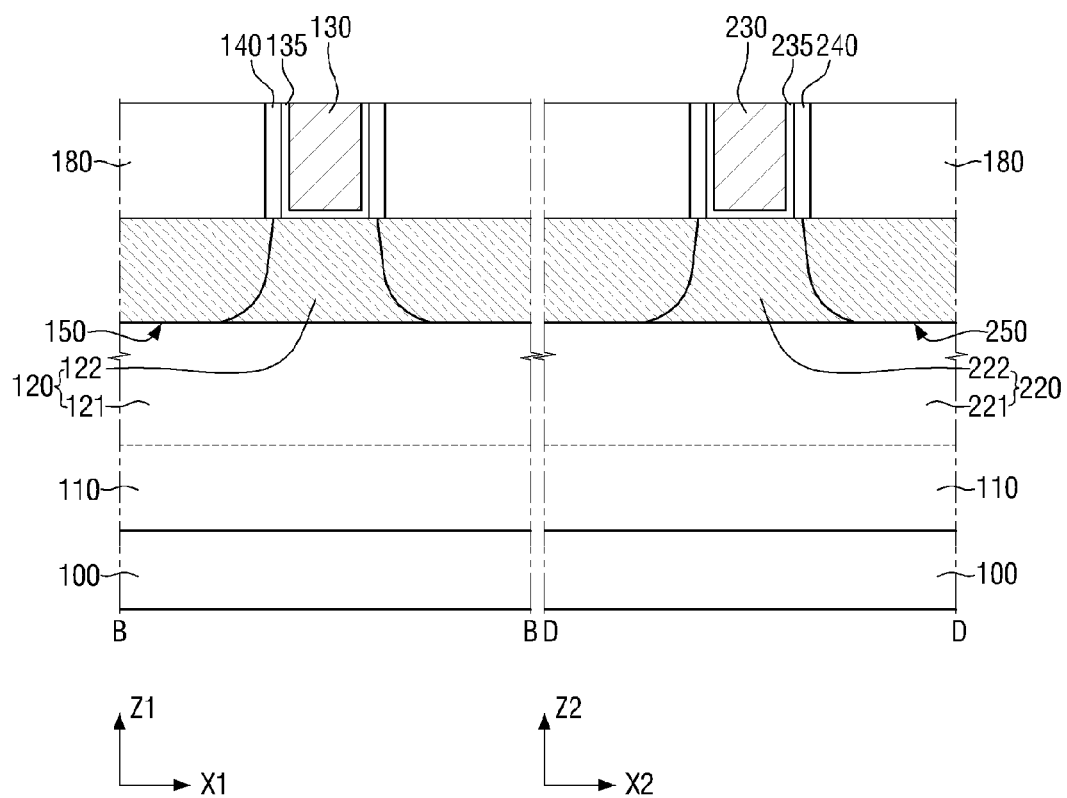
FIG. 3 is a cross-sectional view taken along the lines B-B and D-D of FIG. 1.
Figure 4:
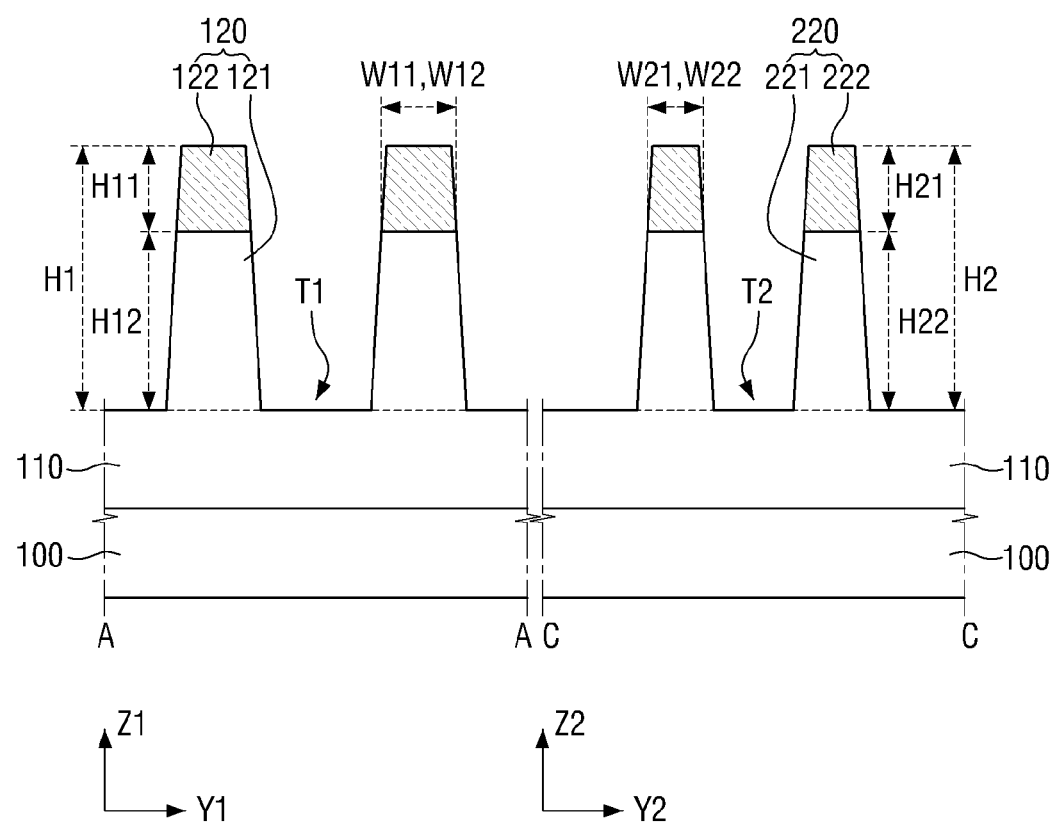
FIG. 4 illustrates the semiconductor device excluding a gate electrode, a gate insulating layer and a field insulating layer from FIG. 2.

FIG. 1 is a layout diagram illustrating the semiconductor device according some example embodiments. FIG. 2 is a cross-sectional view taken along the lines A-A and C-C of FIG. 1. FIG. 3 is a cross-sectional view taken along the lines B-B and D-D of FIG. 1. FIG. 4 illustrates the semiconductor device excluding a gate electrode, a gate insulating layer and a field insulating layer from FIG. 2.

Referring to FIG. 1 to FIG. 4, a semiconductor device 1 according to some example embodiments may include a strain buffer layer 110, a first fin pattern 120, a second fin pattern 220, a first gate electrode 130 and a second gate electrode 230.

A substrate 100 may include a first region I and a second region II. The first region I and the second region II may be spaced apart from each other or interconnected with each other.

The first region I and the second region II may have transistors of different conductive types formed therein. For example, the first region I may include a part in which an N-type transistor is formed, and the second region II may include a part in which a P-type transistor is formed.

The substrate 100 may include, for example, a bulk silicon substrate, a silicon-on-insulator (SOI) substrate, a silicon substrate, silicon germanium, a silicon-germanium-on-insulator (SGOI) substrate, silicon carbide, indium antimonide, lead tellurium compound, indium arsenic, indium phosphide, gallium arsenic, or gallium antimonide, but the present disclosure is not limited thereto.

In some example embodiments, the substrate 100 is a silicon substrate including silicon.

The strain buffer layer 110 may be formed on the substrate 100. The strain buffer layer 110 may include a compound semiconductor, such that the strain buffer layer 110 is a compound semiconductor layer.

The strain buffer layer 110 may include one or more of a group IV-IV compound semiconductor and a group III-V compound semiconductor.

A group IV-IV compound semiconductor may include one of a binary compound and a ternary compound. The group IV-IV compound semiconductor may include at least two of carbon (C), silicon (Si), germanium (Ge) and tin (Sn). The group IV-IV compound semiconductor may include a compound formed by doping a group IV element thereto.

A group III-V compound semiconductor may include one of a binary compound, a ternary compound and a quaternary compound. A quaternary compound may be formed by bonding at least one of aluminum (Al), gallium (Ga) and indium (In) as a group III element and either phosphorus (P) or arsenic (As) as a group V element.

The strain buffer layer 110 may be formed on the substrate 100 through an epitaxial growth process. For example, the strain buffer layer 110 may be formed through at least one of an atmospheric pressure chemical vapor deposition (AP-CVD), low (or reduced) pressure chemical vapor deposition (LPCVD), ultra-high vacuum chemical vapor deposition (UHV-CVD), molecular beam epitaxy (MBE), metal organic chemical vapor deposition (MOCVD), and the like, but the present disclosure is not limited thereto.

The strain buffer layer 110 may include a crystal structure, where the crystal structure of the strain buffer layer 110 is the same as a crystal structure of the substrate 100. In semiconductor substrates according to some example embodiments, the silicon substrate used as the substrate 100 may have a diamond crystal structure. In some example embodiments, a strain buffer layer 110 including a compound semiconductor may have a zinc-blende crystal structure.

In some example embodiments, the strain buffer layer 110 is a silicon germanium layer.

The strain buffer layer 110 may include, for example, $Si_{1-x}Ge_x$, wherein x is a value that is larger than zero and smaller than 1. The germanium fraction of the strain buffer layer 110 may be larger than the germanium fraction of the substrate 100 provided beneath the strain buffer layer 110.

The germanium fraction of the strain buffer layer 110 may be uniform in a thickness direction, or may vary in the thickness direction. It will be understood that a thickness direction may refer to a direction spanning orthogonally to an interface between the strain buffer layer 110 and the substrate 100.

In some embodiments, when the germanium fraction of the strain buffer layer 110 varies in the thickness direction, the germanium fraction of the strain buffer layer 110 may vary in direct proportion with increasing distance from the substrate 100 through the strain buffer layer 110. In some embodiments, when the germanium fraction of the strain buffer layer 110 varies in the thickness direction, the germanium fraction of the strain buffer layer 110 may vary in inverse proportion with increasing distance from the substrate 100 through the strain buffer layer 110. The germanium fraction of the strain buffer layer 110 may vary with distance through the thickness of the strain buffer layer 110 according to one or more fraction profiles with which the strain buffer layer 110 is associated. A fraction profile may represent a particular variation of a germanium fraction included in the strain buffer layer 110 according to a distance through the thickness of the strain buffer layer 110 from the substrate 100.

A field insulating layer 105 may be formed on the strain buffer layer 110. The field insulating layer 105 may include, for example, an oxide layer, a nitride layer, an oxynitride layer or a combination thereof.

The first fin pattern 120 may protrude from the strain buffer layer 110 in the first region I. In some example embodiments, the field insulating layer 105 formed on the strain buffer layer 110 may cover a part of the first fin pattern 120, and at least a part of the first fin pattern 120 may protrude above an upper surface of the field insulating layer 105. The first fin pattern 120 may protrude in a direction Z1, as shown in FIG. 2.

The first fin pattern 120 may be at least partially bounded by the field insulating layer 105. The first fin pattern 120 may extend in a first direction X1.

The first fin pattern 120 may include a first lower pattern 121 and a first upper pattern 122 sequentially stacked on the strain buffer layer 110, such that the first lower pattern 121 and the first upper pattern 122 are sequentially stacked on the compound semiconductor layer. The first lower pattern 121 and the first upper pattern 122 may extend in the first direction X1 similarly to the first fin pattern 120.

The first lower pattern 121 may be a lower part of the first fin pattern 120, and the first upper pattern 122 may be an upper part of the first fin pattern 120. For example, the first upper pattern 122 and the first lower pattern 121 may directly contact each other. The first upper pattern 122 may be an epitaxial layer formed on the first lower pattern 121.

The second fin pattern 220 may protrude from the strain buffer layer 110 in the second region II. In some example embodiments, the field insulating layer 105 formed on the strain buffer layer 110 may cover a part of the second fin pattern 220, and at least a part of the second fin pattern 220 may protrude above the upper surface of the field insulating layer 105. The second fin pattern 220 may protrude in a direction Z2, as shown in FIG. 2.

The second fin pattern 220 may be at least partially bounded by the field insulating layer 105. The second fin pattern 220 may extend in a third direction X2.

The second fin pattern 220 may include a second lower pattern 221 and a second upper pattern 222 sequentially stacked on the strain buffer layer 110, such that the second lower pattern 221 and the first upper pattern 222 are sequentially stacked on the compound semiconductor layer. The second lower pattern 221 and the second upper pattern 222 may extend in the third direction X2 similarly to the second fin pattern 220.

The second lower pattern 221 may be a lower part of the second fin pattern 220, and the second upper pattern 222 may be an upper part of the second fin pattern 220. For example, the second upper pattern 222 and the second lower pattern 221 may directly contact each other. The second upper pattern 222 may be an epitaxial layer formed on the second lower pattern 221.

In FIG. 2, for mere convenience of description, the field insulating layer 105 is depicted as entirely covering sidewalls of the first lower pattern 121 and sidewalls of the second lower pattern 221, and the first upper pattern 122 and the second upper pattern 222 are depicted as not contacting the field insulating layer 105, but the present disclosure is not limited thereto.

In some example embodiments, each of the first upper pattern 122 and the second upper pattern 222 may be a channel region of a transistor.

In some example embodiments, each of the first lower pattern 121 and the second lower pattern 221 may be formed by etching a part of the strain buffer layer 110.

For example, the first lower pattern 121 may be formed by a first trench T1 formed in the strain buffer layer 110 in the first region I, and the second lower pattern 221 may be formed by a second trench T2 formed in the strain buffer layer 110 in the second region II.

In some example embodiments, when the first trench T1 and the second trench T2 are simultaneously formed in the strain buffer layer 110, the first lower pattern 121 and the second lower pattern 221 may be formed at the same level. The term "same level" as used herein means being formed by the same fabrication process.

Thus, materials included in the first lower pattern 121 and the second lower pattern 221 may be the same materials included in the strain buffer layer 110. For example, in semiconductor devices according to some example embodiments, the strain buffer layer 110 may be a silicon germanium layer, and therefore, the first lower pattern 121 and the second lower pattern 221 may also be a silicon germanium layer.

In addition, like the strain buffer layer 110, the germanium fraction of each of the first lower pattern 121 and the second lower pattern 221 may be uniform in a thickness direction or may vary in the thickness direction.

At corresponding heights, the lattice constant of the material included in the first lower pattern 121 may be substantially equal to the lattice constant of the material included in the second lower pattern 221. For example, when the germanium fraction of each of the first lower pattern 121 and the second lower pattern 221 is uniform in the thickness direction, the lattice constant of the material included in the first lower pattern 121 may be equal to the lattice constant of the material included in the second lower pattern 221.

Each of the first upper pattern 122 and the second upper pattern 222 may include element semiconductor material. For example, each of the first upper pattern 122 and the second upper pattern may include silicon or germanium. Furthermore, each of the first upper pattern 122 and the second upper pattern 222 may include a compound semiconductor, for example, a group IV-IV compound semiconductor or a group III-V compound semiconductor.

Specifically, as an example of the group IV-IV compound semiconductor, each of the first upper pattern 122 and the second upper pattern 222 may include a binary compound or a ternary compound including at least two of carbon (C), silicon (Si), germanium (Ge) and tin (Sn), or may include a compound formed by doping a group IV element thereto.

As an example of the group III-V compound semiconductor, each of the first upper pattern 122 and the second upper pattern 222 may include one of a binary compound, a ternary compound and a quaternary compound formed by bonding at least one of aluminum (Al), gallium (Ga) and indium (In) as a group III element and one of phosphorus (P), arsenic (As) and antimony (Sb) as a group V element.

In semiconductor devices according to some example embodiments, the first upper pattern 122 and the second upper pattern 222 may include different materials. For example, the first upper pattern 122 may be a silicon pattern including silicon, and the second upper pattern 222 may be a silicon germanium pattern including silicon germanium.

In some embodiments, where a first fin pattern 120 includes a first material and a second fin pattern 220 includes a second material, the first fin pattern may be associated with a first lattice constant and the second material may be associated with a second lattice constant. The first and second lattice constants may be different. Where the first material is included in the first upper pattern 122, the first upper pattern 122 may be associated with a first lattice constant. The first lattice constant may be different from a lattice constant of a material included in the first lower pattern 121. Where the second material is included in the second upper pattern 222, the second upper pattern 222 may be associated with a second lattice constant. The second lattice constant may be different from a lattice constant of a material included in the second lower pattern 221. The first and second lower patterns 121 and 221 may be associated with a common lattice constant. For example, the first and second lower patterns 121 and 221 may include a common material, where the common material is different from the first and second materials included in respective first and second upper patterns 122 and 222.

Where the material included in the first upper pattern 122 is silicon and the material included in the second upper pattern 222 is silicon germanium, the lattice constant of the material included in the first upper pattern 122 may be different from the lattice constant of the material included in the second upper pattern 222. More specifically, the lattice constant of the material included in the first upper pattern 122 may be smaller than the lattice constant of the material included in the second upper pattern 222.

The first fin pattern 120 includes the first lower pattern 121 which may be a silicon germanium pattern and the first upper pattern 122 which may be a silicon pattern. Thus, the lattice constant of the material included in the first upper pattern 122 may be smaller than the lattice constant of the material included in the first lower pattern 121.

Thus, tensile stress may be applied to the first upper pattern 122, where the first upper pattern 122 is used as a channel region of a transistor, thereby improving mobility of electrons passing through the first upper pattern 122.

The second fin pattern 220 includes the second lower pattern 221 which may be a silicon germanium pattern and the second upper pattern 222 which may be a silicon germanium pattern. That is, the second fin pattern 220 may be a silicon germanium pattern as a whole.

However, the germanium fraction of the second lower pattern 221 may be different from the germanium fraction of the second upper pattern 222. The second upper pattern 222 may include, for example, $Si_{1-y}Ge_y$, wherein y may be a value that is larger than zero and smaller than 1.

For example, the germanium fraction of the second upper pattern 222 may be larger than the germanium fraction of the second lower pattern 221. Thus, the lattice constant of the material included in the second upper pattern 222 may be larger than the lattice constant of the material included in the second lower pattern 221.

Thus, compressive stress may be applied to the second upper pattern 222, where the second upper pattern 222 is used as a channel region of a transistor, thereby improving mobility of electrons and/or holes passing through the second upper pattern 222.

The first fin pattern 120 includes the first lower pattern 121 which may be a silicon germanium pattern and the first upper pattern 122 which may be a silicon pattern, however, the second fin pattern 220 includes the second lower pattern 221 which may be a silicon germanium pattern and the second upper pattern 222 which may be a silicon germanium pattern. Thus, the first fin pattern 120 and the second fin pattern 220 may include different materials.

The first gate electrode 130 may extend in a second direction Y1 and intersect the first fin pattern 120. The first gate electrode 130 may be formed on the first fin pattern 120 and the field insulating layer 105. Furthermore, the first gate electrode 130 may cover a portion of the first fin pattern 120 that protrudes above the upper surface of the field insulating layer 105.

The second gate electrode 230 may extend in a fourth direction Y2 and intersect the second fin pattern 220. The second gate electrode 230 may be formed on the second fin pattern 220 and the field insulating layer 105. Furthermore, the second gate electrode 230 may cover a portion of the second fin pattern 120 that protrudes from the upper surface of the field insulating layer 105.

Each of the first gate electrode 130 and the second gate electrode 230 may include, for example, at least one of polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al) and tungsten (W).

The first gate electrode 130 and the second gate electrode 230 may be formed, for example, through a replacement process (or a gate last process), but the present disclosure is not limited thereto.

A first gate insulating layer 135 may be formed between the first fin pattern 120 and the first gate electrode 130. The first gate insulating layer 135 may be formed along the profile of the first fin pattern 120 protruded further upward than the field insulating layer 105. Furthermore, the first gate insulating layer 135 may be interposed between the first gate electrode 130 and the field insulating layer 105.

A second gate insulating layer 235 may be formed between the second fin pattern 220 and the second gate electrode 230. The second gate insulating layer 235 may be formed along the profile of the second fin pattern 220 protruded further upward than the field insulating layer 105. Furthermore, the second gate insulating layer 235 may be interposed between the second gate electrode 230 and the field insulating layer 105.

An interfacial layer may further be formed between the first gate insulating layer 135 and the first fin pattern 120 and between the second gate insulating layer 235 and the second fin pattern 220.

Each of the first gate insulating layer 135 and the second gate insulating layer 235 may include silicon oxide, silicon oxynitride, silicon nitride and a high dielectric constant material having a dielectric constant higher than that of the silicon oxide. The high dielectric constant material may include one or more among, for example, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A first gate spacer 140 may be formed on sidewalls of the first gate electrode 130 extending in the second direction Y1. A second gate spacer 240 may be formed on sidewalls of the second gate electrode 230 extending in fourth second direction Y2.

Each of the first gate spacer 140 and the second gate spacer 240 may include, for example, at least one of silicon nitride (SiN), silicon oxynitride (SiON), silicon oxide (SiO2), silicon carbon oxynitride (SiOCN) and a combination thereof.

A first source/drain 150 may be formed at both sides of the first gate electrode 130, and a second source/drain 250 may be formed at both sides of the second gate electrode 230. As shown in FIG. 3, the first source/drain 150 and the second source/drain 250 may be formed by doping impurities in the fin patterns 120 and 220, respectively. Furthermore, the first source/drain 150 and the second source/drain 250 may include epitaxial layers formed on the fin patterns 120 and 220, respectively.

In some example embodiments, referring to FIG. 1 and FIG. 4, the first fin pattern 120 may be at least partially defined by the first trench T1 having a first depth H1, and the second fin pattern 220 may be at least partially defined by the second trench T2 having a second depth H2.

In this case, the depth H1 of the first trench T1 may be substantially equal to the height of the first fin pattern 120, and the depth H2 of the second trench T2 may be substantially equal to the height of the second fin pattern 220.

The height H1 of the first fin pattern 120 may be equal to the sum of a height H12 of the first lower pattern 121 and a height H11 of the first upper pattern 122. The height H2 of the second fin pattern 220 may be equal to the sum of a height H22 of the second lower pattern 221 and a height H21 of the second upper pattern 222.

In the semiconductor device according to some example embodiments, the height H1 of the first fin pattern 120 may be substantially equal to the height H2 of the second fin pattern 220. Furthermore, the height H12 of the first lower pattern 121 and the height H22 of the second lower pattern 221 may be substantially the same, and the height H11 of the first upper pattern 122 and the height H21 of the second upper pattern 222 may be substantially the same.

A width W11 of the first upper pattern 122 may be substantially equal to a width W12 of the first lower pattern 121 at the boundary between the first upper pattern 122 and the first lower pattern 121. That is, a step difference may not be formed between the sidewall of the first trench T1 which defines the first upper pattern 122 and the sidewall of the first trench T1 which defines the first lower pattern 121.

It will be understood that the width W11 of the first upper pattern 122 and the width W12 of the first lower pattern 121 may describe the width in the second direction Y1 in which the first gate electrode 130 extends.

A width W21 of the second upper pattern 222 may be substantially equal to a width W22 of the second lower pattern 221 at the boundary between the second upper pattern 222 and the second lower pattern 221. Similarly to the first fin pattern 120, a step difference may not be formed between the sidewall of the second trench T2 which defines the second upper pattern 222 and the sidewall of the second trench T2 which defines the second lower pattern 221.

It will be understood that the width W21 of the second upper pattern 222 and the width W22 of the second lower pattern 221 may describe the width in the fourth direction Y2 in which the second gate electrode 230 extends.

In the semiconductor device according to the first embodiment of the present inventive concept, the width W11 of the first upper pattern 122 may be different from the width W21 of the second upper pattern 222. For example, the width W11 of the first upper pattern 122 may be greater than the width W21 of the second upper pattern 222.

In the description of the present inventive concept, the width of the first fin pattern 120 is defined as the width W11 of the first upper pattern 122 at the boundary between the first upper pattern 122 and the first lower pattern 121, and the width of the second fin pattern 220 is defined as the width W21 of the second upper pattern 222 at the boundary between the second upper pattern 222 and the second lower pattern 221.

Thus, in the semiconductor device according to the first embodiment of the present inventive concept, the width W11 of the first fin pattern 120 may be larger than the width W21 of the second fin pattern 220.

In FIG. 2 and FIG. 4, for mere convenience of description, the width between sidewalls of the first lower pattern 121 and the width between sidewalls of the second lower pattern 221 are depicted as narrowing with increasing distance from the substrate 100, but the present disclosure is not limited thereto.

In some example embodiments, profiles of the sidewalls of the first lower pattern 121 and the sidewalls of the second lower pattern 221 may have various shapes according to the germanium fraction of each of the first lower pattern 121 and the second lower pattern 221.

More specifically, the width between the sidewalls of the first lower pattern 121 and the width between the sidewalls of the second lower pattern 221 may vary with distance from the substrate 100 according to the respective variations in the germanium fraction with distance from the substrate 100 in each of the first lower pattern 121 and the second lower pattern 221. Such variation may include the width between sidewalls of a lower pattern varying in inverse proportion to variations in the germanium fraction in the lower pattern. Such variation may include the width between sidewalls of a lower pattern varying in direct proportion with variations in the germanium fraction in the lower pattern. In some example embodiments, the width between the sidewalls of the first lower pattern 121 and the width between the sidewalls of the second lower pattern 221 may initially decrease and then increase with increasing distance through the first lower pattern 121 and the second lower pattern 221 from the substrate 100. In some example embodiments, the width between the sidewalls of the first lower pattern 121 and the width between the sidewalls of the second lower pattern 221 may increase and then decrease with increasing distance through the first lower pattern 121 and the second lower pattern 221 from the substrate 100. In some example embodiments, the width between the sidewalls of the first lower pattern 121 and the width between the sidewalls of the second lower pattern 221 may be constant with increasing distance through the first lower pattern 121 and the second lower pattern 221.

In some example embodiments, the semiconductor device 1 includes a PMOS and an NMOS in the first and second regions, respectively. For example, the first region may be a region in which an NMOS is formed and the second region may be a region in which a PMOS is formed. A portion of the first fin pattern 120 may serve as a channel layer of the PMOS, and a portion of the second fin pattern 220 may serve as a channel layer of the NMOS. Where the first and second fin patterns include different materials, the semiconductor device can thus include channel layers of a PMOS and an NMOS, where the respective channel layers of the PMOS and the NMOS include different materials. The different materials included in the first and second fin patterns of the respective PMOS and NMOS may result in improved performance of the respective PMOS and NMOS. As a result, including different materials in the different channel layers may improve transistor operating performance. Where material included in a fin pattern of a PMOS is different from material included in a fin pattern of an NMOS, an etch rate of the fin pattern material of the PMOS may be different from an etch rate of the fin pattern material of the NMOS. As a result, a width of channel layer of the PMOS may be different from a width of channel layer of the NMOS, or a height of a fin pattern of the PMOS may be different from a height of a fin pattern of the NMOS.

Figure 5:
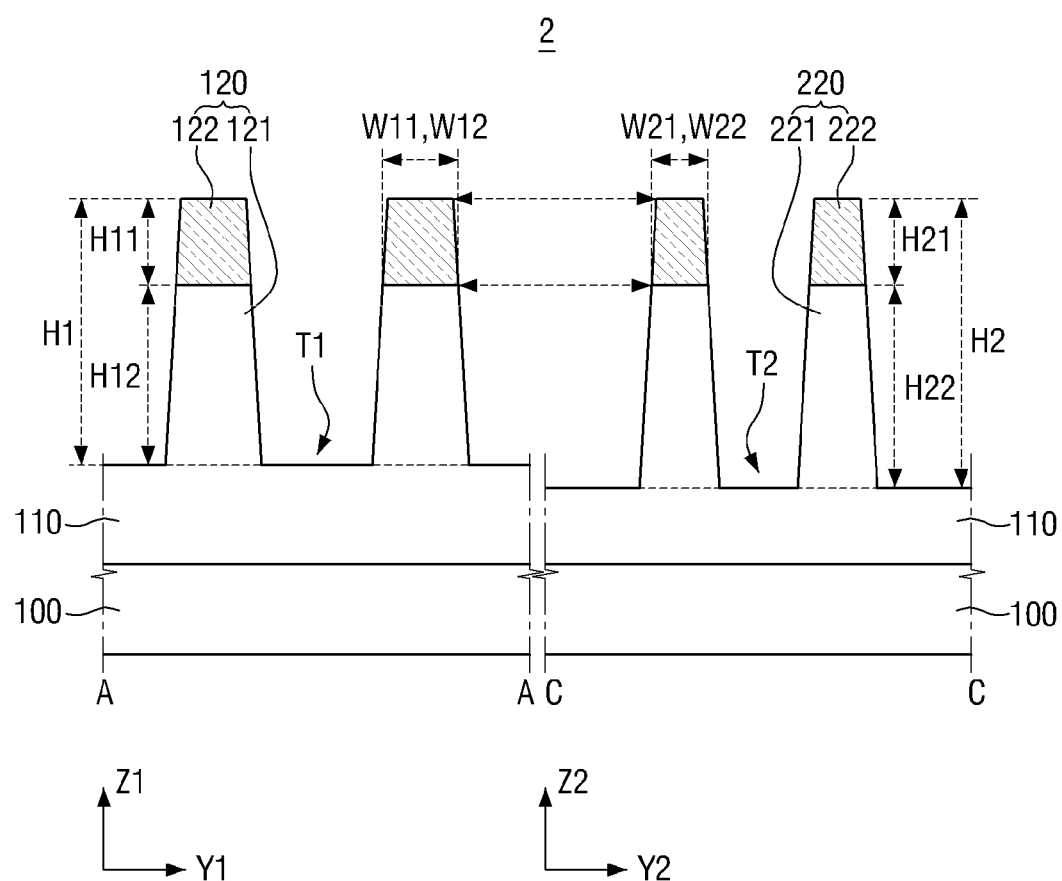
FIG. 5 illustrates a semiconductor device according to some example embodiments.

FIG. 5 illustrates a semiconductor device according to some example embodiments. For convenience of description, differences between the example embodiments described with reference to FIG. 1 to FIG. 4 and the example embodiments described with reference to FIG. 5 will be chiefly described.

Referring to FIG. 5, in a semiconductor device 2 according to some example embodiments, the depth H1 of the first trench T1 which defines the first fin pattern 120 may be different from the depth H2 of the second trench T2 which defines the second fin pattern 220, such that the height H1 of the first fin pattern 120 may be different from the height H2 of the second fin pattern 220.

For example, the depth H1 of the first trench T1 may be shallower than the depth H2 of the second trench T2. Thus, the height H2 of the second fin pattern 220 may be greater than the height H1 of the first fin pattern 120.

The height H11 of the first upper pattern 122 may be substantially equal to the height H21 of the second upper pattern 222.

In some example embodiments, the height H12 of the first lower pattern 121 may be different from the height H22 of the second lower pattern 221. For example, the height H12 of the first lower pattern 121 may be lower than the height H22 of the second lower pattern 221.

Figure 6:
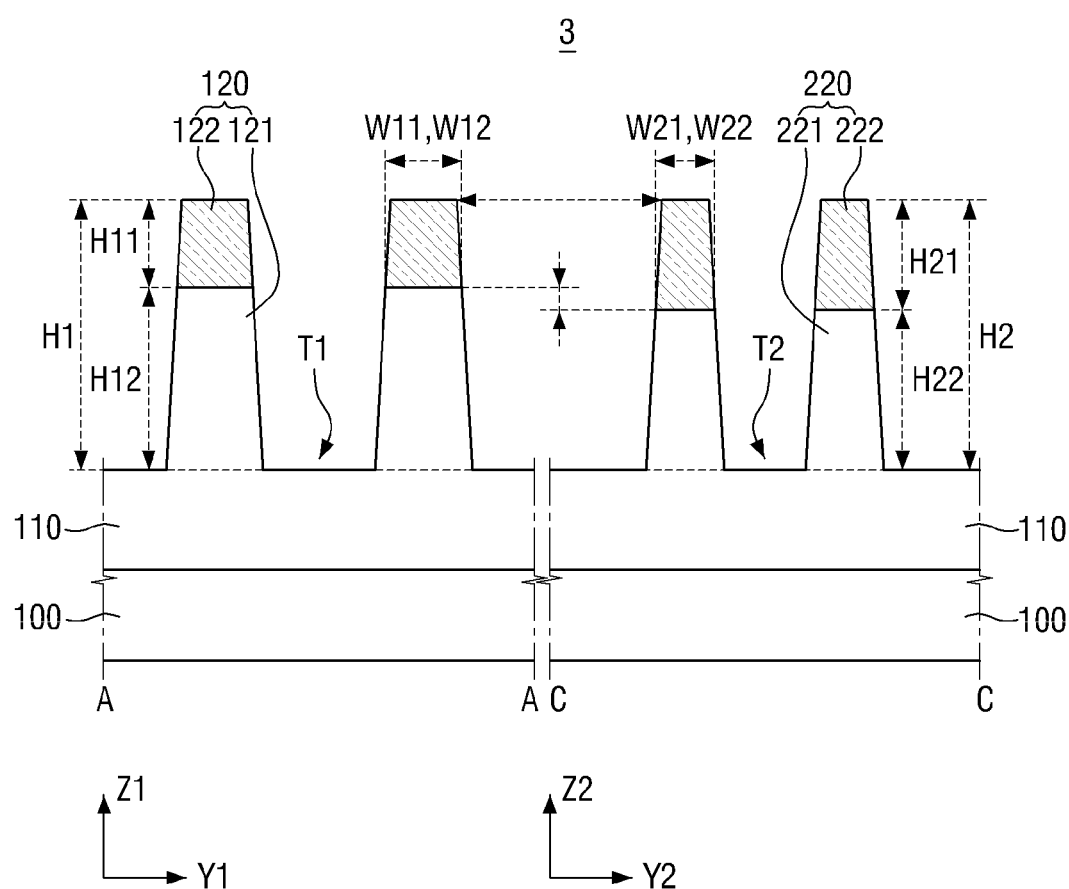
FIG. 6 illustrates a semiconductor device according to some example embodiments.

FIG. 6 illustrates a semiconductor device according to some example embodiments. For convenience of description, differences between example embodiments described with reference to FIG. 1 to FIG. 4 and example embodiments described with reference to FIG. 6 will be chiefly described.

Referring to FIG. 6, in a semiconductor device 3 according to some example embodiments, the height H11 of the first upper pattern 122 may be different from the height H21 of the second upper pattern 222.

In some example embodiments, the height H1 of the first fin pattern 120 may be substantially equal to the height H2 of the second fin pattern 220.

Thus, the height H12 of the first lower pattern 121 may be different from the height H22 of the second lower pattern 221.

The height H11 of the first upper pattern 122 is depicted as being lower than the height H21 of the second upper pattern 222 in FIG. 6, but the present disclosure is not limited thereto. That is, the height H11 of the first upper pattern 122 may be greater than the height H21 of the second upper pattern 222.

The above-described difference in height between the height of the first upper pattern 122 and the height of the second upper pattern 222 may vary according to which of a first upper layer that or a second upper layer is formed prior to the formation of the first trench T1 and the second trench T2. The first upper pattern 122 may be formed from the first upper layer, and the second upper pattern 222 may be formed from the second upper layer.

For example, when the first upper layer is grown first and then a part of the first upper layer is etched and the second upper layer is grown in the etched area, the height H11 of the first upper pattern 122 may be lower than the height H21 of the second upper pattern 222. In another example, when the second upper layer is grown first and then the first upper layer is grown, the height H11 of the first upper pattern 122 may be greater than the height H21 of the second upper pattern 222.

In addition, through example embodiments described with reference to FIG. 5 and example embodiments described with reference to FIG. 6, it will be understood that some example embodiments may include a semiconductor device in which the height H2 of the second fin pattern 220 is greater than the height H1 of the first fin pattern 120 and the height H11 of the first upper pattern 122 is different from the height H21 of the second upper pattern 222.

Figure 7:
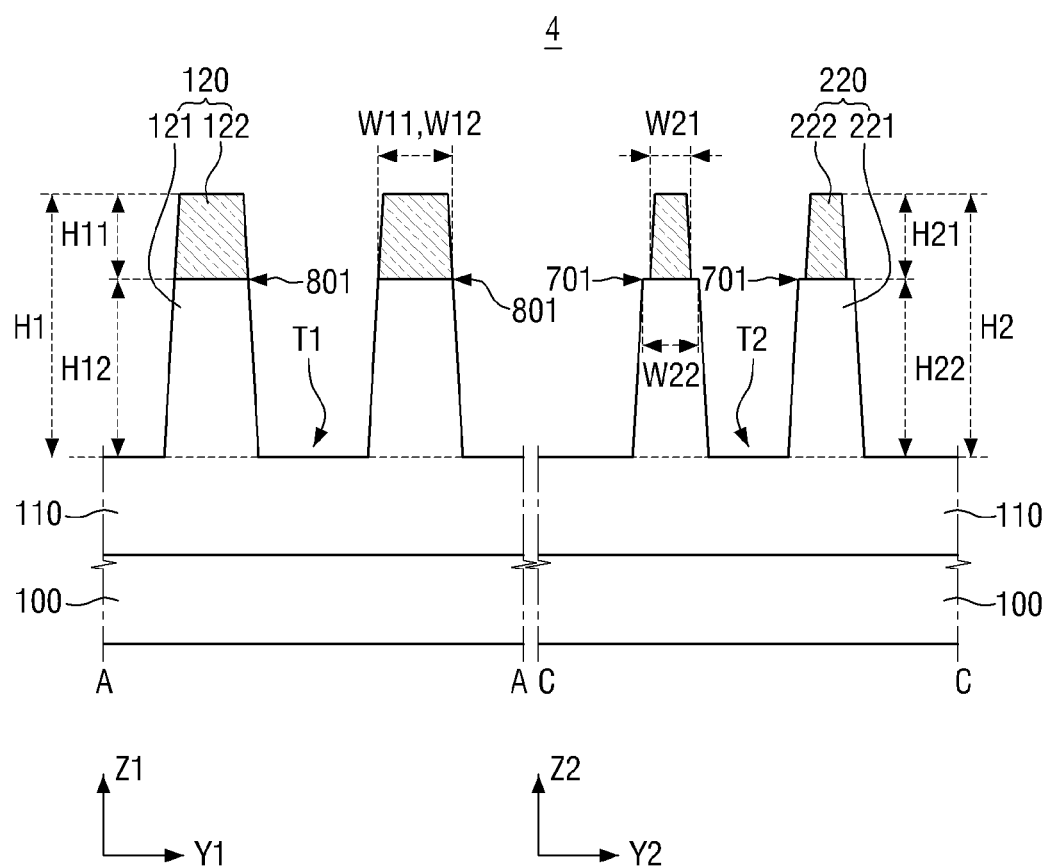
FIG. 7 illustrates a semiconductor device according to some example embodiments.

FIG. 7 illustrates a semiconductor device according to some example embodiments. For convenience of description, differences between the example embodiments described with reference to FIG. 1 to FIG. 4 and example embodiments described with reference to FIG. 7 will be chiefly described.

Referring to FIG. 7, in a semiconductor device 4 according to some example embodiments, the width W21 of the second upper pattern 222 may be different from the width W22 of the second lower pattern 221 at the boundary 701 between the second upper pattern 222 and the second lower pattern 221.

For example, the width W21 of the second upper pattern 222 may be narrower than the width W22 of the second lower pattern 221 at the boundary 701 between the second upper pattern 222 and the second lower pattern 221. Consequently, a step difference may be formed between the sidewall of the second trench T2 which defines the second upper pattern 222 and the sidewall of the second trench T2 which defines the second lower pattern 221.

In this case, the width W11 of the first upper pattern 122 may be substantially equal to the width W12 of the first lower pattern 121 at the boundary 801 between the first upper pattern 122 and the first lower pattern 121. That is, a step difference may not be formed between the sidewall of the first trench T1 which defines the first upper pattern 122 and the sidewall of the first trench T1 which defines the first lower pattern 121.

Figure 8:
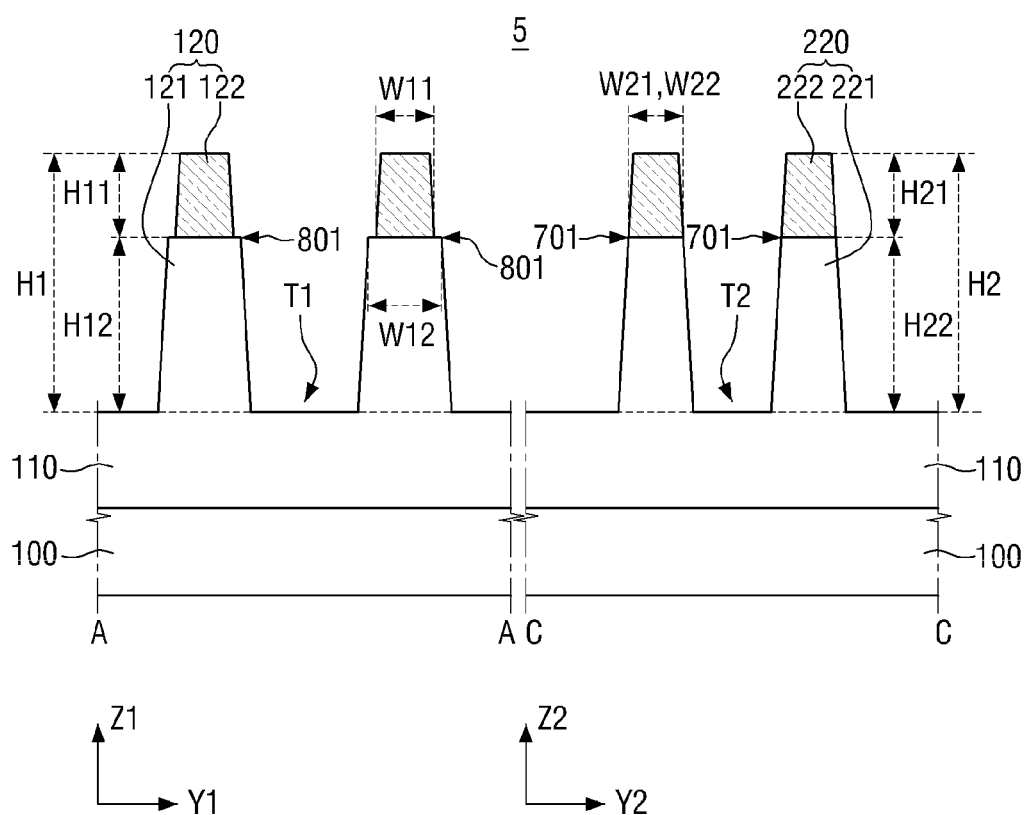
FIG. 8 illustrates a semiconductor device according to some example embodiments.

FIG. 8 illustrates a semiconductor device according to some example embodiments. For convenience of description, differences between the example embodiments described with reference to FIG. 1 to FIG. 4 example embodiments described with reference to FIG. 8 will be chiefly described.

Referring to FIG. 8, in a semiconductor device 5 according to some example embodiments, the width W11 of the first upper pattern 122 may be different from the width W12 of the first lower pattern 121 at the boundary 801 between the first upper pattern 122 and the first lower pattern 121.

For example, the width W11 of the first upper pattern 122 may be narrower than the width W12 of the first lower pattern 121 at the boundary 801 between the first upper pattern 122 and the first lower pattern 121. Consequently, a step difference may be formed between the sidewall of the first trench T1 which defines the first upper pattern 122 and the sidewall of the first trench T1 which defines the first lower pattern 121.

In this case, the width W21 of the second upper pattern 222 may be substantially equal to the width W22 of the second lower pattern 221 at the boundary 701 between the second upper pattern 222 and the second lower pattern 221. That is, a step difference may not be formed between the sidewall of the second trench T2 which defines the second upper pattern 222 and the sidewall of the second trench T2 which defines the second lower pattern 221.

In addition, the width W11 of the first upper pattern 122 may be different from or substantially equal to the width W21 of the second upper pattern 222 depending on the change in the width W11 of the first upper pattern 122 with respect to the width W12 of the first lower pattern 121.

Figure 9:
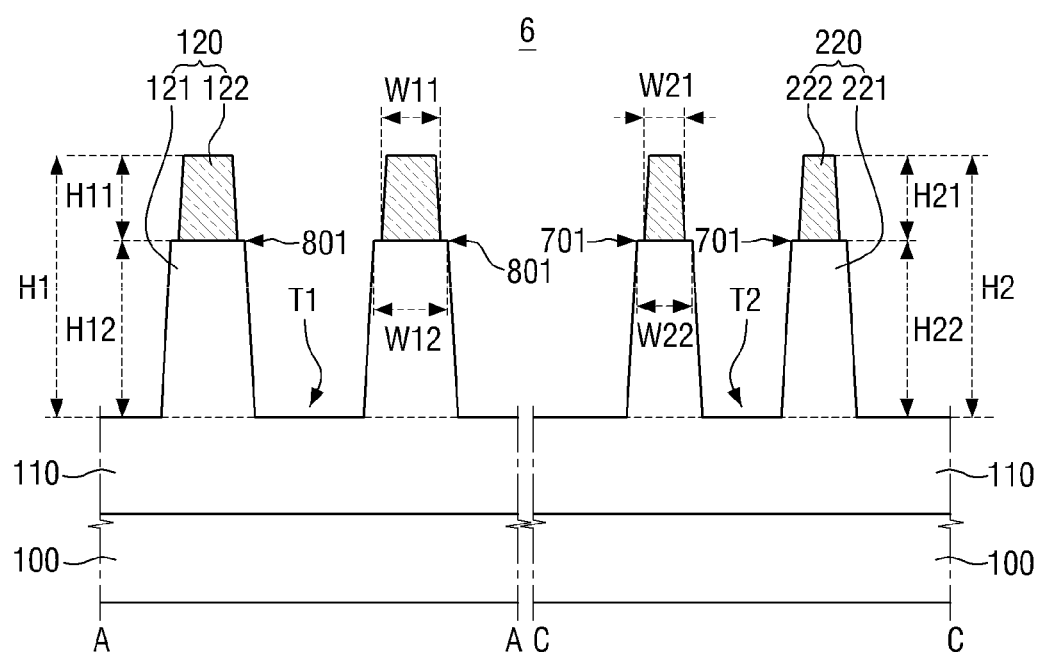
FIG. 9 illustrates a semiconductor device according to some example embodiments.

FIG. 9 illustrates a semiconductor device according to some example embodiments. For convenience of description, differences between the example embodiments described with reference to FIG. 1 to FIG. 4 and example embodiments described with reference to FIG. 9 will be chiefly described.

Referring to FIG. 9, in a semiconductor device 6 according to some example embodiments, the width W11 of the first upper pattern 122 may be different from the width W12 of the first lower pattern 121 at the boundary 801 between the first upper pattern 122 and the first lower pattern 121. In addition, the width W21 of the second upper pattern 222 may be different from the width W22 of the second lower pattern 221 at the boundary 701 between the second upper pattern 222 and the second lower pattern 221.

For example, the width W11 of the first upper pattern 122 may be narrower than the width W12 of the first lower pattern 121 at the boundary 801 between the first upper pattern 122 and the first lower pattern 121, and the width W21 of the second upper pattern 222 may be narrower than the width W22 of the second lower pattern 221 at the boundary 701 between the second upper pattern 222 and the second lower pattern 221.

Consequently, a step difference may be formed between the sidewall of the first trench T1 which defines the first upper pattern 122 and the sidewall of the first trench T1 which defines the first lower pattern 121, and between the sidewall of the second trench T2 which defines the second upper pattern 222 and the sidewall of the second trench T2 which defines the second lower pattern 221.

The width W11 of the first upper pattern 122 may be different from or substantially equal to the width W21 of the second upper pattern 222 depending on the change in the width W11 of the first upper pattern 122 with respect to the width W12 of the first lower pattern 121 and the change in the width W21 of the second upper pattern 222 with respect to the width W22 of the second lower pattern 221.

Figure 10:
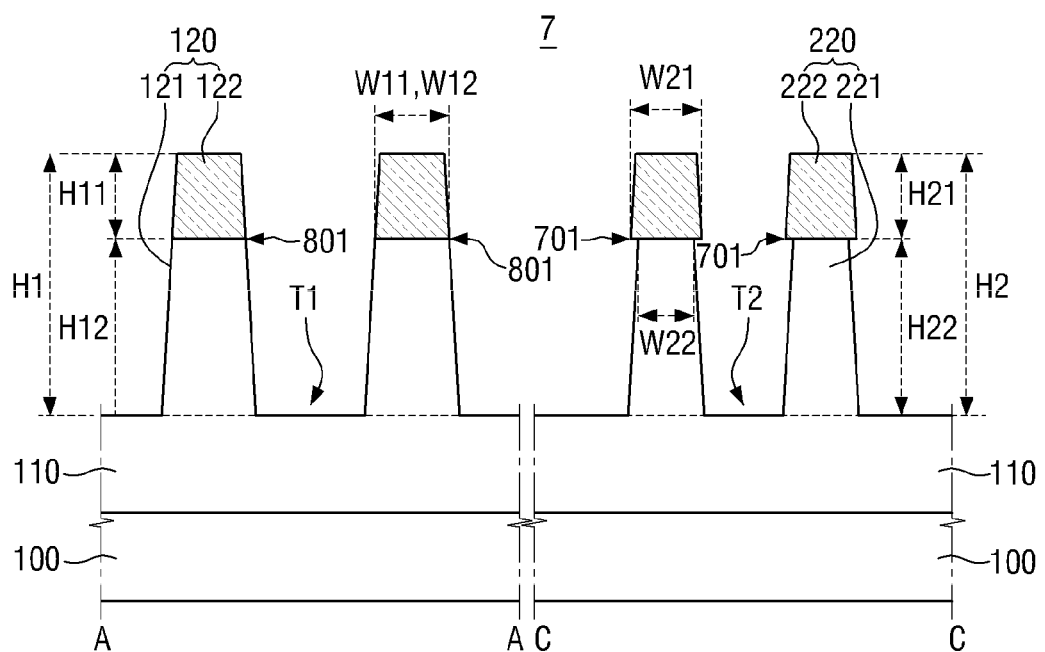
FIG. 10 illustrates a semiconductor device according to some example embodiments.

FIG. 10 illustrates a semiconductor device according to some example embodiments. For convenience of description, differences between the example embodiments described with reference to FIG. 1 to FIG. 4 and example embodiments described with reference to FIG. 10 will be chiefly described.

Referring to FIG. 10, in a semiconductor device 7 according to some example embodiments, the width W21 of the second upper pattern 222 may be different from the width W22 of the second lower pattern 221 at the boundary 701 between the second upper pattern 222 and the second lower pattern 221.

For example, the width W22 of the second lower pattern 221 may be narrower than the width W21 of the second upper pattern 222 at the boundary 701 between the second upper pattern 222 and the second lower pattern 221.

Consequently, an undercut may be formed between the sidewall of the second trench T2 which defines the second upper pattern 222 and the sidewall of the second trench T2 which defines the second lower pattern 221.

In this case, the width W11 of the first upper pattern 122 may be substantially equal to the width W12 of the first lower pattern 121 at the boundary 801 between the first upper pattern 122 and the first lower pattern 121.

In some example embodiments, a semiconductor device includes a first lower pattern 121, where the first lower pattern 121 includes a width W12 that is narrower than the width W11 of the first upper pattern 122 at the boundary 801 between the first upper pattern 122 and the first lower pattern 121. The semiconductor device may further include a second upper pattern 222, where the second upper pattern includes a width W21 that is substantially equal to the width W22 of the second lower pattern 221 at the boundary 701 between the second upper pattern 222 and the second lower pattern 221.

Alternatively, the width W12 of the first lower pattern 121 may be narrower than the width W11 of the first upper pattern 122 at the boundary 801 between the first upper pattern 122 and the first lower pattern 121, and the width W22 of the second lower pattern 221 may be narrower than the width W21 of the second upper pattern 222 at the boundary 701 between the second upper pattern 222 and the second lower pattern 221.

Figure 11:
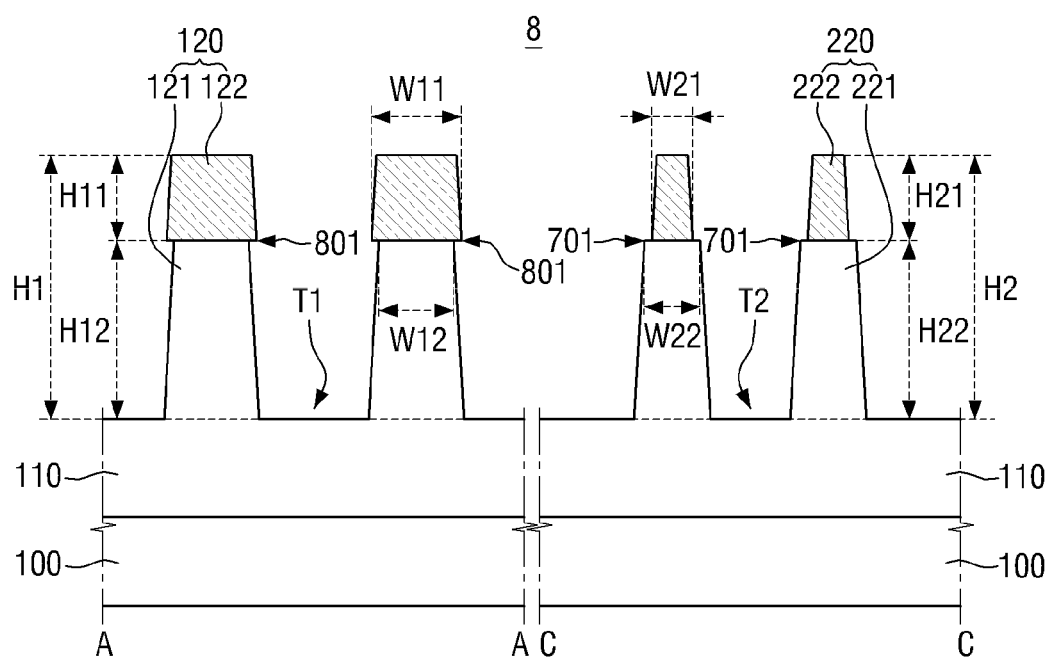
FIG. 11 illustrates a semiconductor device according to some example embodiments.

FIG. 11 illustrates a semiconductor device according to some example embodiments. For convenience of description, differences between the example embodiments described with reference to FIG. 1 to FIG. 4 and example embodiments described with reference to FIG. 11 will be chiefly described.

Referring to FIG. 11, in a semiconductor device 8 according to some example embodiments, the width W12 of the first lower pattern 121 may be narrower than the width W11 of the first upper pattern 122 at the boundary 801 between the first upper pattern 122 and the first lower pattern 121.

The width W21 of the second upper pattern 222 may be narrower than the width W22 of the second lower pattern 221 at the boundary 701 between the second upper pattern 222 and the second lower pattern 221.

Consequently, an undercut may be formed between the sidewall of the first trench T1 which defines the first upper pattern 122 and the sidewall of the first trench T1 which defines the first lower pattern 121. Furthermore, a step difference may be formed between the sidewall of the second trench T2 which defines the second upper pattern 222 and the sidewall of the second trench T2 which defines the second lower pattern 221.

In some example embodiments, a semiconductor device includes a first upper pattern 122, where the first upper pattern 122 has a width W11 that is narrower than the width W12 of the first lower pattern 121 at the boundary 801 between the first upper pattern 122 and the first lower pattern 121. The semiconductor device may further include a second upper pattern 222, where the second upper pattern 222 has a width W21 that is wider than the width W22 of the second lower pattern 221 at the boundary 701 between the second upper pattern 222 and the second lower pattern 221.

In some example embodiments, the width W11 of the first upper pattern 122 may be different from or substantially equal to the width W21 of the second upper pattern 222 depending on the change in the width W11 of the first upper pattern 122 with respect to the width W12 of the first lower pattern 121.

Figure 12:
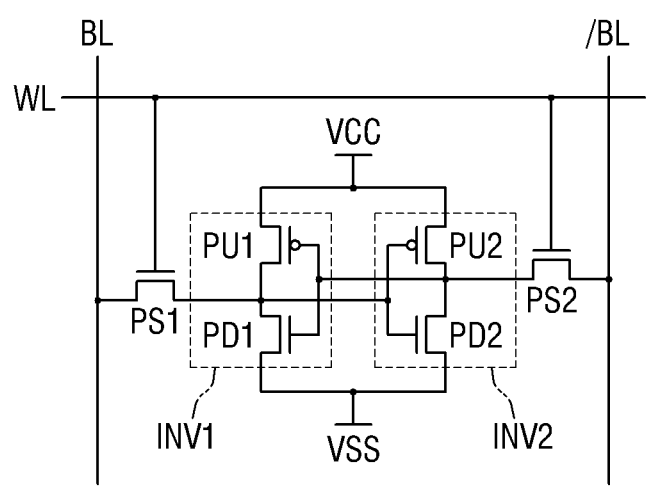
FIG. 12 is a circuit diagram illustrating a semiconductor device according to some example embodiments.
Figure 13:
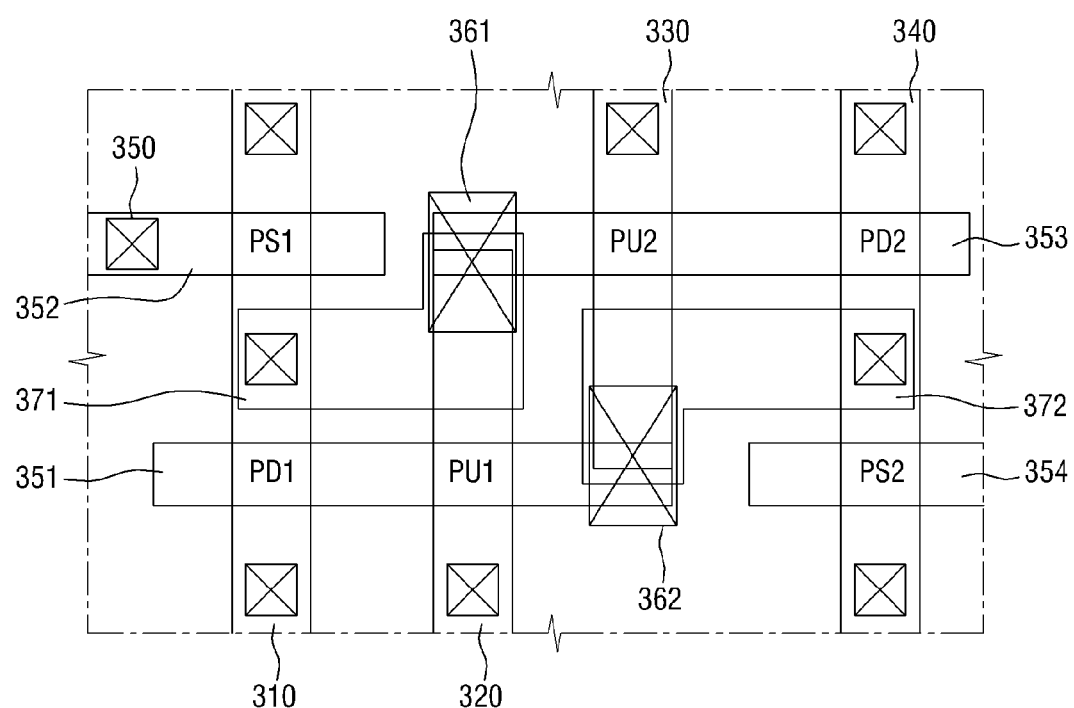
FIG. 13 is a layout diagram illustrating the semiconductor device of FIG. 12.

FIG. 12 is a circuit diagram illustrating a semiconductor device according to some example embodiments. FIG. 13 is a layout diagram illustrating the semiconductor device of FIG. 12.

Referring to FIG. 12, a semiconductor device 9 may include a pair of inverters INV1 and INV2 connected in parallel between a power node Vcc and a ground node Vss, and a first pass transistor PS1 and a second pass transistor PS2 connected to the respective output nodes of the inverters INV1 and INV2. The first pass transistor PS1 and the second pass transistor PS2 may be connected to a bit line BL and a complementary bit line BL, respectively. Gates of the first pass transistor PS1 and the second pass transistor PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PFET transistor, and the first pull-down transistor PD1 and the second pull-down transistor PD2 may be NFET transistor.

Furthermore, an input node of the first inverter INV1 is connected to the output node of the second inverter INV2, and an input node of the second inverter INV2 is connected to the output node of the first inverter INV1 so as to construct a single latch circuit.

In this case, referring to FIG. 12 and FIG. 13, a first active fin 310, a second active fin 320, a third active fin 330 and a fourth active fin 340 which are spaced apart from each other may be formed to extend long in one direction (for example, a vertical direction in FIG. 13). The second active fin 320 and the third active fin 330 may extend shorter than the first active fin 310 and the fourth active fin 340.

Furthermore, a first gate line 351, a second gate line 352, a third gate line 353 and a fourth gate line 354 may be formed to extend long in the other direction (for example, a horizontal direction in FIG. 13), and intersect the first active fin 310 to the fourth active fin 340.

Specifically, the first gate line 351 may entirely intersect the first active fin 310 and the second active fin 320, and may be partially overlapped with an end of the third active fin 330. The third gate line 353 may entirely intersect the fourth active fin 340 and the third active fin 330, and may be partially overlapped with an end of the second active fin 320. The second gate line 352 and the fourth gate line 354 may intersect the first active fin 310 and the fourth active fin 340, respectively.

As shown in the drawings, the first pull-up transistor PU1 is defined around the region in which the first gate line 351 and the second active fin 320 intersect with each other, the first pull-down transistor PD1 is defined around the region in which the first gate line 351 and the first active fin 310 intersect with each other, and the first pass transistor PS1 is defined around the region in which the second gate line 352 and the first active fin 310 intersect with each other.

The second pull-up transistor PU2 is defined around the region in which the third gate line 353 and the third active fin 330 intersect with each other, the second pull-down transistor PD2 is defined around the region in which the third gate line 353 and the fourth active fin 340 intersect with each other, and the second pass transistor PS2 is defined around the region in which the fourth gate line 354 and the fourth active fin 340 intersect with each other.

Although not clearly shown, a source/drain and a plurality of contacts 350 may be formed at both sides of the region in which the first to fourth gate lines 351 to 354 and the first to fourth active fins 310 to 340 intersect with each other.

Furthermore, a first shared contact 361 may interconnect all of the second active fin 320, the third gate line 353 and a wire 371. A second shared contact 362 may interconnect all of the third active fin 330, the first gate line 351 and a wire 372.

At least one of the above-described semiconductor devices according to the embodiments of the present inventive concept may be employed in such an SRAM layout.

Figure 14:
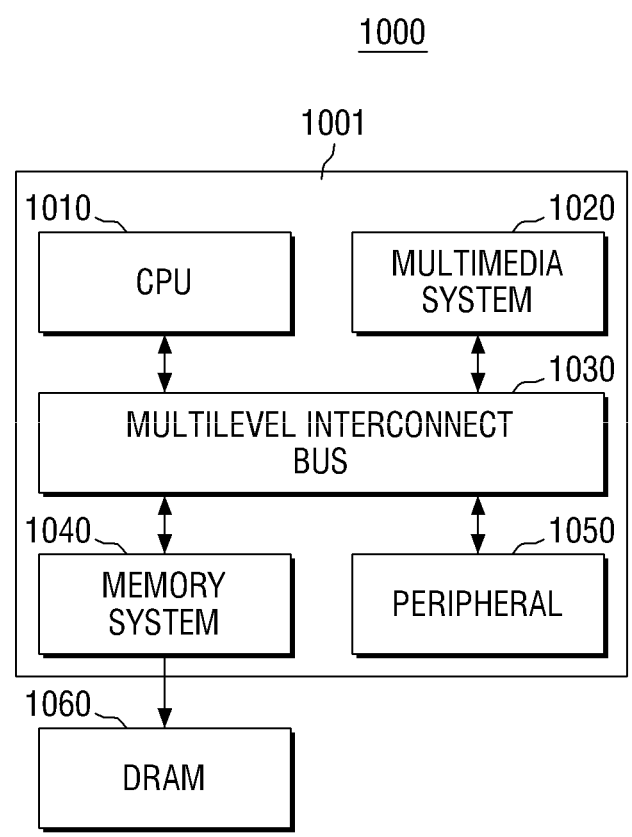
FIG. 14 is a block diagram of an SoC system including semiconductor devices according to some example embodiments.

FIG. 14 is a block diagram of an SoC system including the semiconductor devices according to some example embodiments.

Referring to FIG. 14, an SoC system 1000 includes an application processor 1001 and a DRAM 1060.

The application processor 1001 may include a central processing unit 1010, a multimedia system 1020, a bus 1030, a memory system 1040 and a peripheral circuit 1050.

The central processing unit 1010 may perform an arithmetic operation required for driving the SoC system 1000. In some example embodiments, the central processing unit 1010 may be configured into a multi-core environment including a plurality of cores.

The multimedia system 1020 may be used in performing various multimedia functions in the SoC system 1000. The multimedia system 1020 may include a 3D engine module, a video codec, a display system, a camera system, a post-processor, and the like.

The bus 1030 may be used in data communication among the central processing unit 1010, the multimedia system 1020, the memory system 1040 and the peripheral circuit 1050. In some example embodiments, the bus 1030 may have a multi-layer structure. Specifically, examples of the bus 1030 may include a multi-layer advanced high-performance bus (AHB) and a multi-layer advanced extensible interface (AXI), but the present disclosure is not limited thereto.

The memory system 1040 may provide an environment that enables the application processor 1001 to be connected to an external memory (for example, the DRAM 1060) and operate at high speed. In some example embodiments, the memory system 1040 may include a separate controller (for example, a DRAM controller) for controlling the external memory (for example, the DRAM 1060).

The peripheral circuit 1050 may provide an environment that enables the SoC system 1000 to be smoothly connected to an external device (for example, a main board). Thus, the peripheral circuit 1050 may be provided with various interfaces for compatibility of the external device connected to the SoC system 1000.

The DRAM 1060 may function as an operation memory required for operating the application processor 1001. In some example embodiments, the DRAM 1060 may be disposed outside the application processor 1001 as shown in the drawings. Specifically, the DRAM 1060 may be packaged with the application processor 1001 into a package-on-package structure.

At least one of the above-described components of the SoC system 1000 may include at least one of the above-described semiconductor devices according to some example embodiments.

Figure 15:
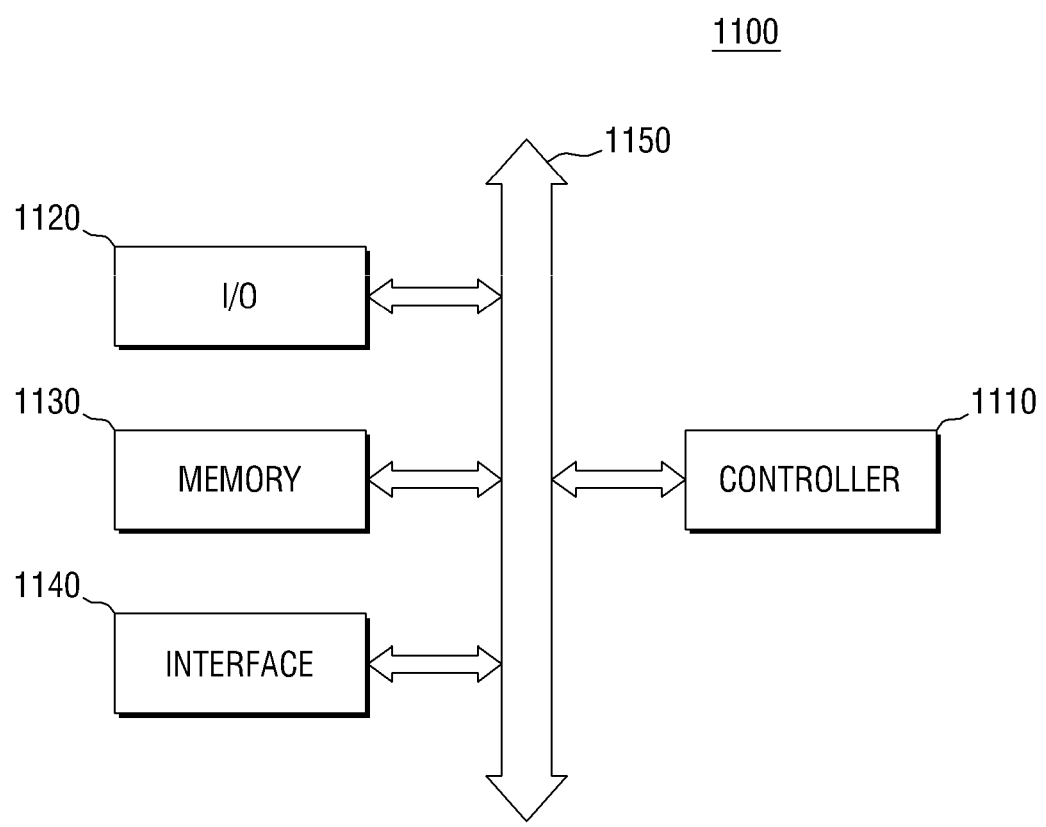
FIG. 15 is a block diagram of an electronic system including semiconductor devices according to some example embodiments.

FIG. 15 is a block diagram of an electronic system including the semiconductor devices according to some example embodiments.

Referring to FIG. 15, an electronic system 1100 according to some example embodiments may include a controller 1110, an input/output (I/O) device 1120, a memory device 1130, an interface 1140 and a bus 1150. The controller 1110, the input/output device 1120, the memory device 1130 and/or the interface 1140 may be coupled with each other through the bus 1150. The bus 1150 may serve as a path for data movement.

The controller 1110 may include at least one of a microprocessor, a digital signal processor, a microcontroller, and logic elements capable of performing functions similar to those of the microprocessor, the digital signal processor, and the microcontroller. The input/output device 1120 may include a keypad, a keyboard, a display device, and the like. The memory device 1130 may store therein data and/or instructions, and the like. The interface 1140 may perform the function of transmitting data to a communication network or receiving data from the communication network. The interface 1140 may be of a wired or wireless type. For example, the interface 1140 may include an antenna, a wired/wireless transceiver, or the like.

Although not shown, the electronic system 1100 may further include a high speed DRAM and/or SRAM and the like as an operation memory for improving operation of the controller 1110.

The above-described semiconductor devices according to some example embodiments may be provided within the memory device 1130, or may be provided as a part of the controller 1110, the input/output device 1120, and the like.

The electronic system 1100 may be applicable to a personal digital assistant (PDA), a portable computer, a web tablet, a wireless phone, a mobile phone, a digital music player, a memory card, or all electronic products that can transmit and/or receive information in a wireless environment.

Figure 16:
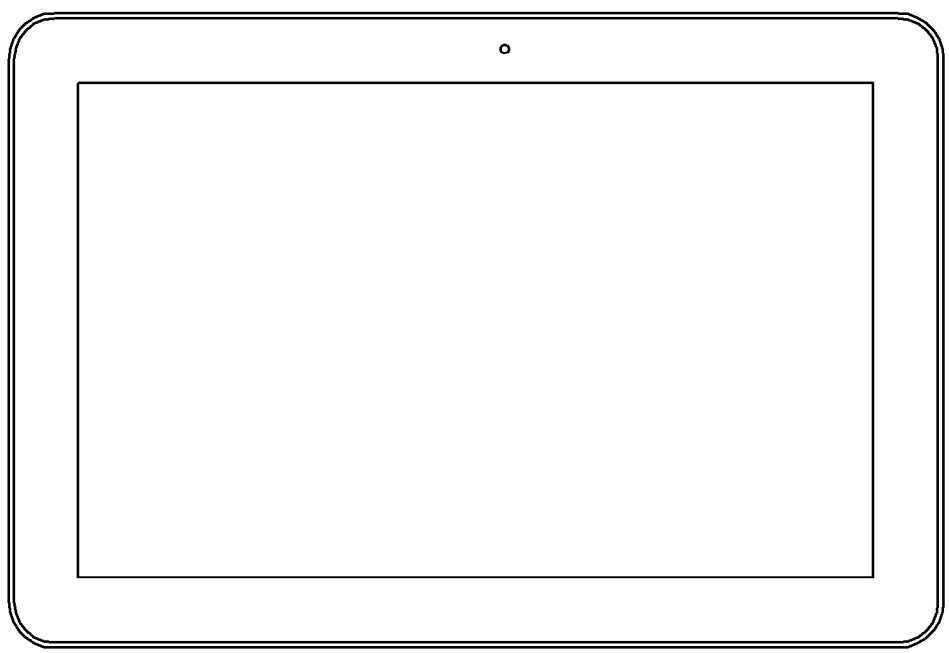
FIG. 16 to FIG. 18 illustrate examples of semiconductor systems to which semiconductor devices according to some example embodiments can be applied.
Figure 17:
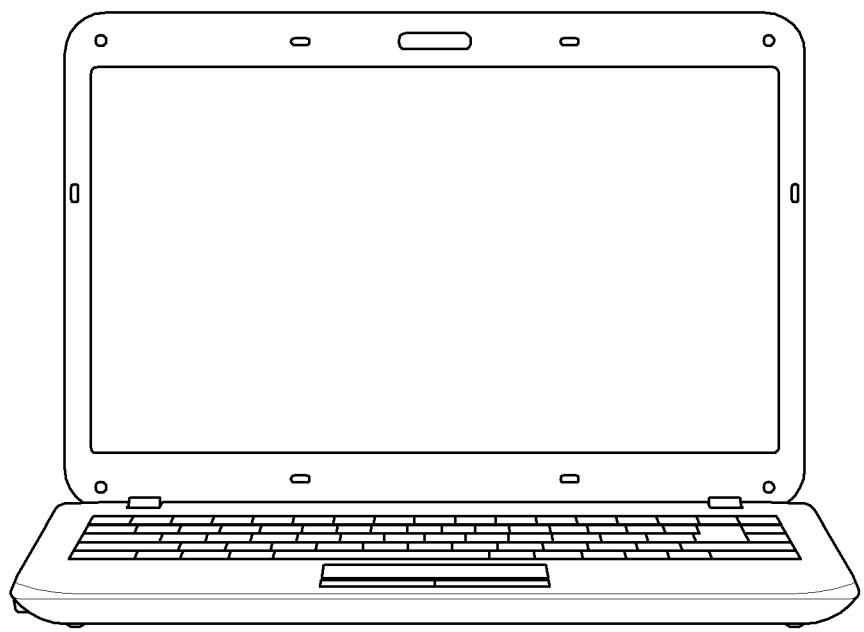
Figure 18:
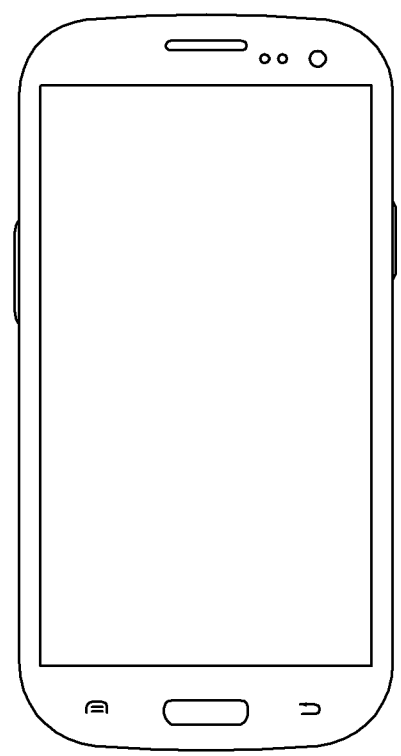

FIG. 16 to FIG. 18 illustrate examples of semiconductor systems to which semiconductor devices according to some example embodiments may be applied.

FIG. 16 illustrates a tablet PC 1200, FIG. 17 illustrates a notebook computer 1300, and FIG. 18 illustrates a smart phone 1400. The above-described semiconductor devices according to some example embodiments can be used in the tablet PC 1200, the notebook computer 1300, the smart phone 1400, and the like.

Furthermore, it would be readily apparent to those skilled in the art that the semiconductor devices according to some example embodiments may be also applied to other integrated circuit devices which are not set forth herein.

That is, the tablet PC 1200, the notebook computer 1300 and the smart phone 1400 are described above as examples of the semiconductor systems according to some example embodiment, however, the examples of the semiconductor systems according to some example embodiments are not limited thereto.

In some example embodiments, semiconductor systems can be realized as a computer, an ultra-mobile PC (UMPC), a workstation, a net-book, a personal digital assistant (PDA), a portable computer, a wireless phone, a mobile phone, an e-book, a portable multimedia player (PMP), a portable gaming console, a navigation device, a black box, a digital camera, a 3-dimensional television, a digital audio recorder, a digital audio player, a digital picture recorder, a digital picture player, a digital video recorder, a digital video player, and the like.

The foregoing description has been provided for purposes of illustration and description. It is not intended to be exhaustive or to limit the disclosure. Individual elements or features of a particular example embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A semiconductor device comprising:
   a compound semiconductor layer, the compound semiconductor layer including a first region and a second region;
   a first fin pattern protruding from the compound semiconductor layer in the first region, the first fin pattern including a first lower pattern and a first upper pattern, the first upper pattern on the first lower pattern; and
   a second fin pattern protruding from the compound semiconductor layer in the second region, the second fin pattern includes a second lower pattern and a second upper pattern, the second upper pattern on the second lower pattern,
   wherein the first upper pattern includes a first material and the second upper pattern includes a second material, the first material and the second material each being different from a material composition of the compound semiconductor layer, the second material being different from the first material,
   wherein the first fin pattern is associated with a first width and the second fin pattern is associated with a second width, the second width being narrower than the first width,
   wherein the first region is a region in which an NMOS is formed and the second region is a region in which a PMOS is formed,
   wherein a width of the second upper pattern is different from a width of the second lower pattern at a boundary between the second upper pattern and the second lower pattern, such that a step difference is formed between a sidewall of a trench that defines the second upper pattern and a sidewall of the trench that defines the second lower pattern.

2. The semiconductor device of claim 1, wherein
   the first material is associated with a first lattice constant,
   the second material is associated with a second lattice constant, and
   the first lattice constant is different from than the second lattice constant.

3. The semiconductor device of claim 2, wherein
   the first lattice constant is different from than a lattice constant of a material included in the first lower pattern, and
   the second lattice constant is different from a lattice constant of a material included in the second lower pattern.

4. The semiconductor device of claim 1, wherein a height of the first upper pattern is different from a height of the second upper pattern.

5. The semiconductor device of claim 1, wherein a width of the first upper pattern is different from a width of the second upper pattern.

6. The semiconductor device of claim 1, wherein a height of the first fin pattern is different from a height of the second fin pattern.

7. A semiconductor device comprising:
   a compound semiconductor layer, the compound semiconductor layer including a first region and a second region;
   a first fin pattern, the first fin pattern including a first lower pattern and a first upper pattern, the first lower pattern and the first upper being sequentially stacked on the compound semiconductor layer in the first region such that the first upper pattern is directly on the first lower pattern, the first fin pattern being defined by a first trench having a first depth; and
   a second fin pattern, the second fin pattern including a second lower pattern and a second upper pattern, the second lower pattern and the second upper pattern being sequentially stacked on the compound semiconductor layer in the second region such that the second upper pattern is directly on the second lower pattern, the second fin pattern being defined by a second trench having a second depth, the second depth being different from the first depth;
   wherein the first lower pattern and second lower pattern are each integral with the compound semiconductor layer and have a common material composition with a material composition of the compound semiconductor layer;
   wherein the first upper pattern includes a first material and the second upper pattern including a second material, the first upper pattern and the second upper pattern each being a separate and integral pattern, the first material and the second material each being different from the material composition of the compound semiconductor layer, the second material being different from the first material, the first upper pattern and the second upper pattern each configured to be a channel region of a transistor,
   wherein a width of the second upper pattern is narrower than a width of the second lower pattern at a boundary between the second upper pattern and the second lower pattern, such that a step difference is formed between a sidewall of a trench that defines the second upper pattern and a sidewall of the trench that defines the second lower pattern.

8. The semiconductor device of claim 7, wherein
   a lattice constant of the first material included is different from a lattice constant of the second material.

9. The semiconductor device of claim 7, wherein the first material includes silicon and the second material includes silicon germanium.

10. The semiconductor device of claim 7, wherein a height of the first lower pattern is different from a height of the second lower pattern.

11. The semiconductor device of claim 7, wherein a width of the first upper pattern is different from a width of the second upper pattern.

12. The semiconductor device of claim 7, wherein a width of the first upper pattern is narrower than a width of the first lower pattern at a boundary between the first upper pattern and the first lower pattern, such that a step difference is formed between a sidewall of another trench that defines the first upper pattern and a sidewall of the other trench that defines the first lower pattern.

13. A semiconductor device comprising:
   a compound semiconductor layer, the compound semiconductor layer including a first region and a second region, the compound semiconductor layer including silicon germanium;

a first fin pattern, the first fin pattern including a first lower pattern and a first upper pattern, the first lower pattern and the first upper pattern being sequentially stacked on the compound semiconductor layer in the first region such that the first upper pattern is directly on the first lower pattern, the first lower pattern being a silicon germanium pattern, the first upper pattern being a silicon pattern; and a second fin pattern, the second fin pattern including a second lower pattern and a second upper pattern, the second lower pattern and the second upper pattern being sequentially stacked on the compound semiconductor layer in the second region such that the second upper pattern is directly on the second lower pattern, the second fin pattern being a silicon germanium pattern, the first lower pattern and second lower pattern each being integral with the compound semiconductor layer and having a common material composition with a material composition of the compound semiconductor layer, the first upper pattern and the second upper pattern each being a separate and integral pattern, a germanium fraction of the second upper pattern being greater than a germanium fraction of the second lower pattern and the first lower pattern, and a width of the second upper pattern being different from a width of the first upper pattern, the first upper pattern and the second upper pattern each configured to be a channel region of a transistor, wherein a width of the second upper pattern is different from a width of the second lower pattern at a boundary between the second upper pattern and the second lower pattern, such that a step difference is formed between a sidewall of a trench that defines the second upper pattern and a sidewall of the trench that defines the second lower pattern.

14. The semiconductor device of claim 13, wherein the width of the first upper pattern is different than the width of the second upper pattern.

15. The semiconductor device of claim 13, wherein a height of the first lower pattern is substantially equal to a height of the second lower pattern.

* * * * *